(12) United States Patent
Lee et al.

(10) Patent No.: US 8,604,620 B2
(45) Date of Patent: Dec. 10, 2013

(54) SEMICONDUCTOR STRUCTURE HAVING LATERAL THROUGH SILICON VIA

(75) Inventors: Tzung-Han Lee, Taipei (TW); Chung-Lin Huang, Taoyuan County (TW); Ron Fu Chu, Taipei (TW); Dah-Wei Liu, Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 40 days.

(21) Appl. No.: 13/342,201

(22) Filed: Jan. 3, 2012

(65) Prior Publication Data

US 2013/0113110 A1 May 9, 2013

(30) Foreign Application Priority Data

Nov. 8, 2011 (TW) .............................. 100140793 A

(51) Int. Cl.
*H01L 29/40* (2006.01)
(52) U.S. Cl.
USPC ............. 257/774; 257/E23.011; 257/E21.599
(58) Field of Classification Search
CPC ................ H01L 23/5226; H01L 2924/01078; H01L 2924/01079
USPC ........................... 257/774, E23.011, E21.599
See application file for complete search history.

(56) References Cited

U.S. PATENT DOCUMENTS

| | | | |
|---|---|---|---|
| 4,984,358 A * | 1/1991 | Nelson .......................... | 438/109 |
| 2002/0109133 A1* | 8/2002 | Hikita et al. .................... | 257/10 |
| 2010/0200957 A1* | 8/2010 | Chandrasekaran ........... | 257/618 |
| 2010/0317153 A1* | 12/2010 | Do et al. ........................ | 438/109 |
| 2011/0185330 A1* | 7/2011 | Collins et al. ................. | 716/130 |
| 2012/0097944 A1* | 4/2012 | Lin et al. ......................... | 257/48 |
| 2012/0217644 A1* | 8/2012 | Pagaila ......................... | 257/774 |

\* cited by examiner

*Primary Examiner* — Nikolay Yushin
(74) *Attorney, Agent, or Firm* — Winston Hsu; Scott Margo

(57) ABSTRACT

The present invention provides a semiconductor structure having a lateral TSV and a manufacturing method thereof. The semiconductor structure includes a chip having an active side, a back side disposed opposite to the active side, and a lateral side disposed between the active side and the back side. The chip further includes a contact pad, a lateral TSV and a patterned conductive layer. The contact pad is disposed on the active side. The lateral TSV is disposed on the lateral side. The patterned conductive layer is disposed on the active side and is electrically connected to the lateral TSV and the contact pad.

9 Claims, 6 Drawing Sheets

SEMICONDUCTOR STRUCTURE HAVING LATERAL THROUGH SILICON VIA

BACKGROUND OF THE INVENTION

1. Field of the Invention

The present invention relates to a semiconductor structure and manufacturing method thereof, and more particularly, to a semiconductor structure with a lateral through silicon via (TSV) and a manufacturing method thereof.

2. Description of the Prior Art

In modern society, the micro-processor systems constituted of integrated circuits (IC) are multi-purpose devices, and are utilized in diverse fields such as automatic control electronics, mobile communication devices and personal computers. With the development of technology and the increasingly imaginative applications of electrical products, the IC devices are becoming smaller, more sophisticated and more diversified.

As known in the art, an IC device is produced from dies that are fabricated by conventional semiconductor manufacturing processes. The process to manufacture a die starts with a wafer: first, different regions are marked on the wafer; secondly, conventional semiconductor manufacture processes such as deposition, photolithography, etching or planarization are used to form needed circuit trace(s); then, each region of the wafer is separated to form a die and packaged to form a chip; finally, the chip is attached onto a board, for example a printed circuit board (PCB), and the chip is electrically coupled to the pins on the PCB. Thus, each program on the chip can be performed.

In order to evaluate the functions and the efficiency of the chip, to increase the capacitance density, to accommodate more IC components in a limited space, many semiconductor package technologies are built up by stacking each die and/or chip, for example, Flip-Chip technology, Multi-chip Package (MCP) technology, Package on Package (PoP) technology and Package in Package (PiP) technology. Besides these technologies, a "Through Silicon Via (TSV)" technique has been developed in recent years. The TSV technology can improve the interconnections between chips in the package so as to increase the package efficiency.

By using the TSV technique, there can be a shorter interconnection route between the chips. Thus, in comparison to other technologies, TSV has the advantages of faster speed, less noise and better efficiency, and is therefore a promising technology. However, the current existing TSV is usually stacked in a vertical configuration, as a primary transmission route. It is now still impossible to use three-dimensional stacked structure having multiple stacking directions, which is substantially limiting the applicability of TSV.

SUMMARY OF THE INVENTION

The present invention provides a semiconductor structure with lateral TSV and a manufacturing method thereof to provide three-dimensional stacked chip package.

According to one embodiment of the present invention, a semiconductor structure is provided, that comprises a chip having an active side, a back side opposite to said active side, and a lateral side between said active side and said back side. The chip further comprises a contact pad disposed on said active side of said chip, a lateral TSV disposed on said lateral side and a patterned conductive layer disposed on said active side and electrically connected to said lateral TSV and said contact pad.

According to another embodiment of the present invention, a method of forming a lateral through silicon via (TSV) is provided, which comprises the steps of providing a wafer with a first chip region and a scribe line adjacent to said first chip region. The wafer further comprises a TSV disposed on said scribe line, a first contact pad disposed in said first chip region, and a patterned conductive layer electrically connected to said TSV and said first contact pad, and then dicing said wafer along said scribe line so that a first lateral TSV is formed from said TSV in said first chip region.

The present invention provides a semiconductor structure having lateral through silicon via and a manufacturing method thereof. The semiconductor structure may include one single chip or a chip package constructed by a plurality of chips, in order to increase the signal transmission route between the chips.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
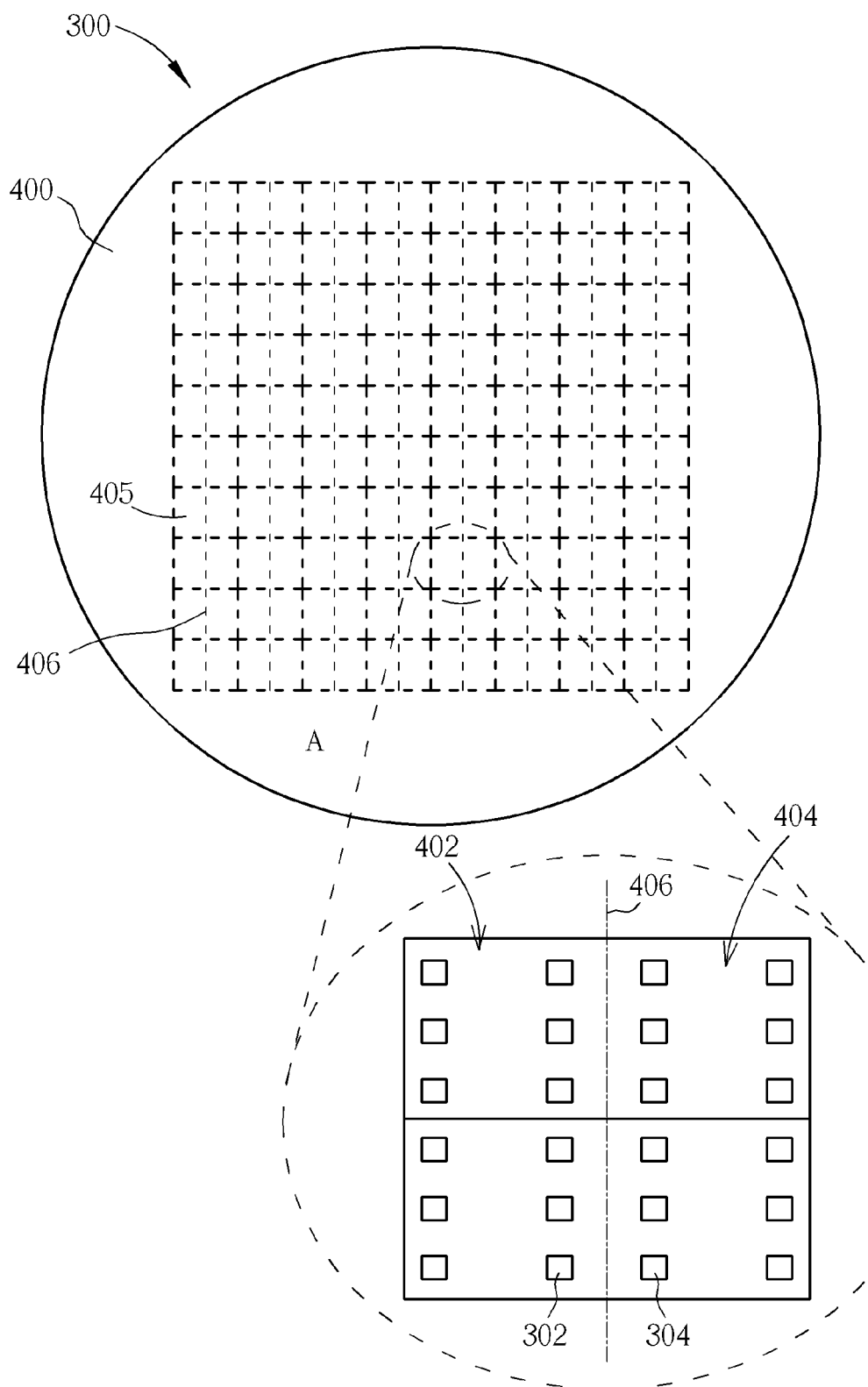
FIGS. 1-7 are schematic views of a manufacturing method for the semiconductor structure having a lateral TSV in accordance with the present invention.
Figure 2:
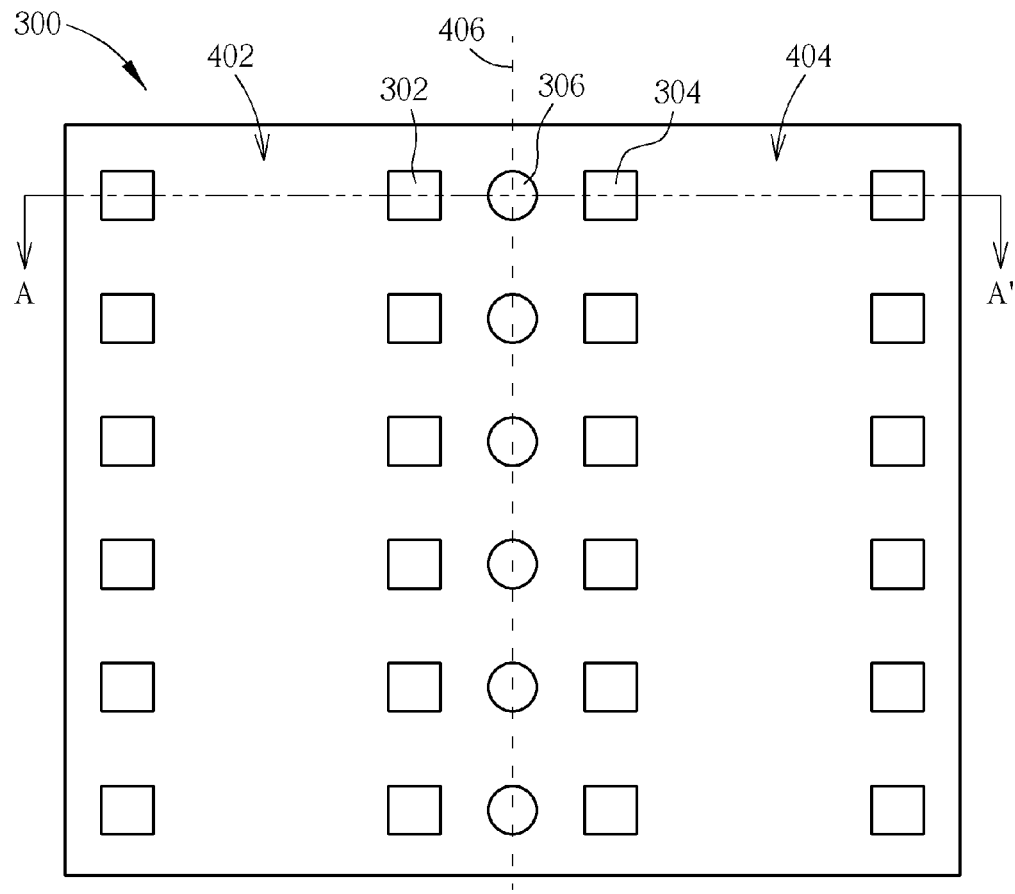
Figure 3:
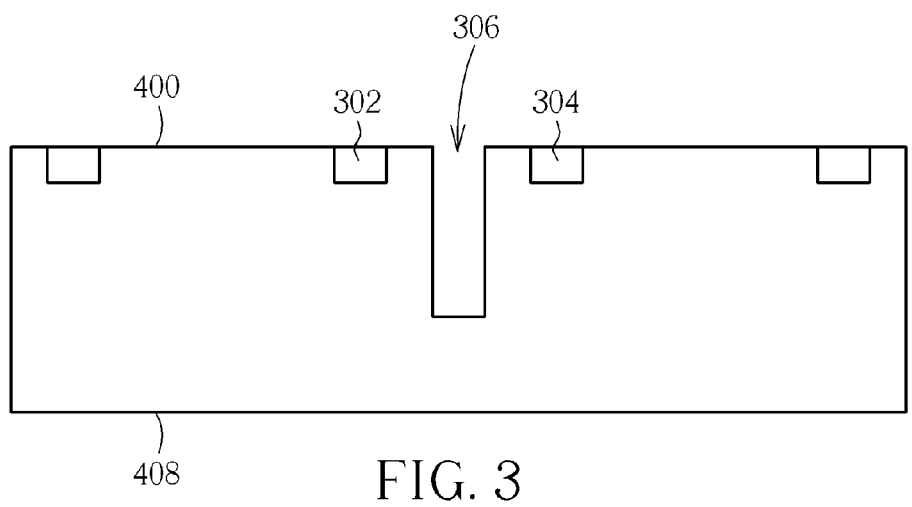
Figure 4:
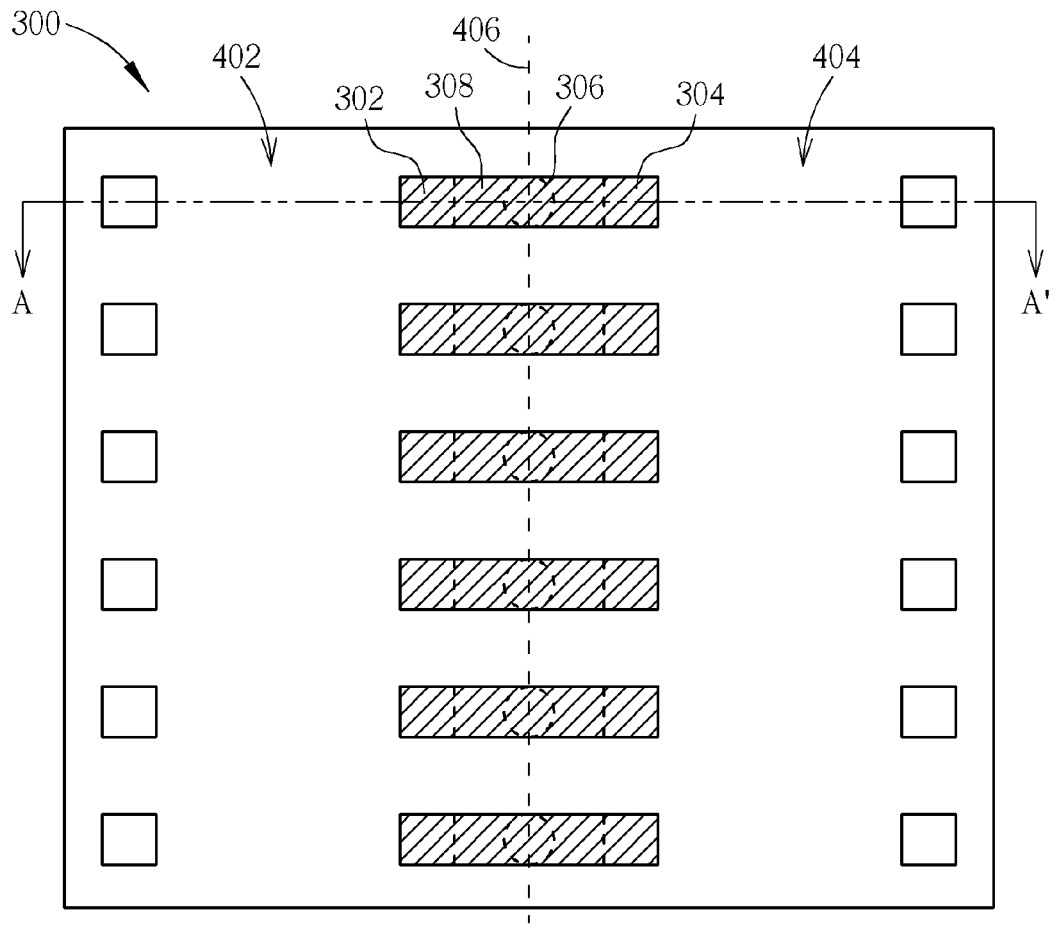
Figure 5:
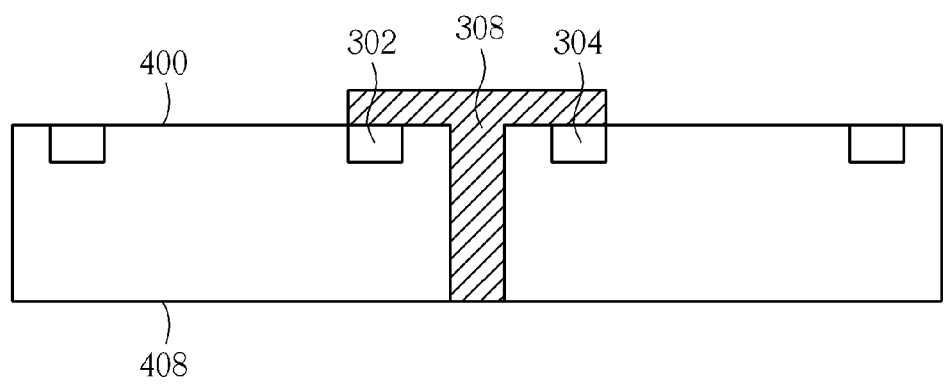
Figure 6:
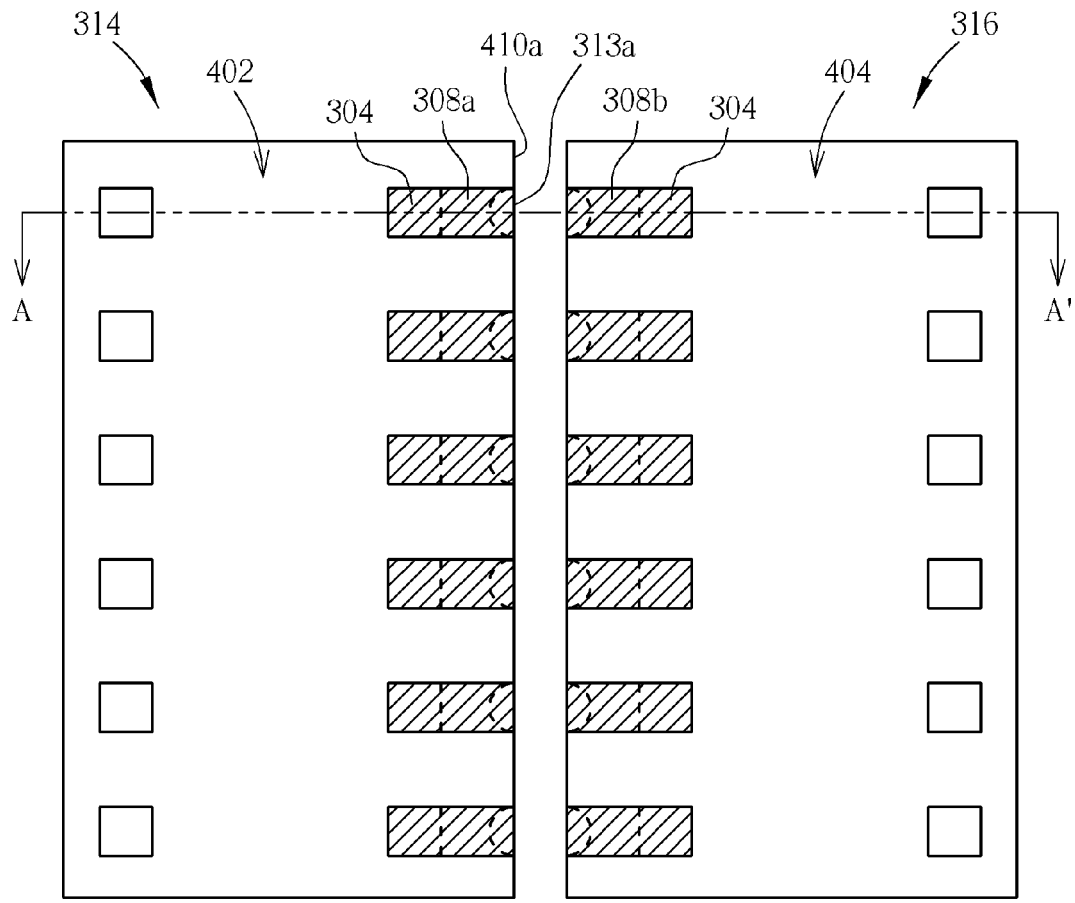
Figure 7:
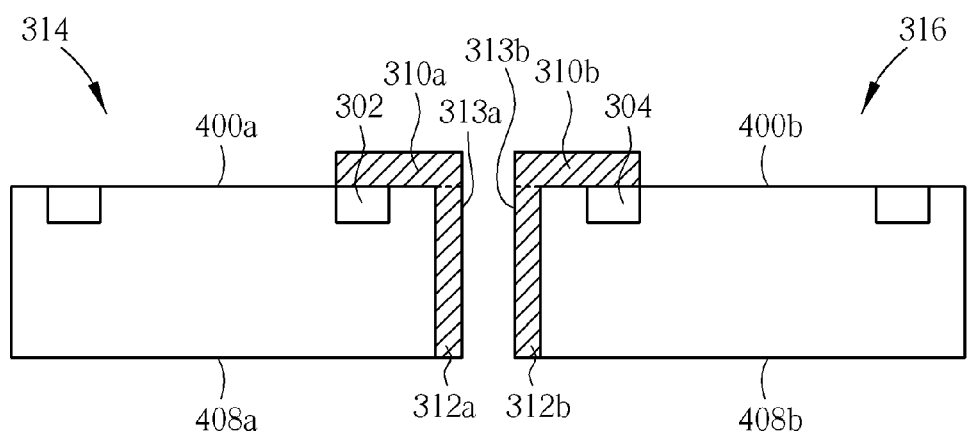

Please refer to FIG. 1 to FIG. 7, which are schematic views of the manufacturing method for the semiconductor structure having lateral TSV according to the present invention, wherein FIG. 2, FIG. 4 and FIG. 6 are enlarged schematic views of a region A in FIG. 1, while FIG. 3, FIG. 5 and FIG. 7 are respectively cross-sectional views of FIG. 2, FIG. 4 and FIG. 6 taken along a line A-A'. As shown in FIG. 1, a wafer 300 with an active side 400 is first provided. In one embodiment of the present invention, the necessary semiconductor devices (not shown) and the metal interconnection connecting those semiconductor devices (not shown) are already formed inside the wafer 300, and a necessary electrical test is also already completed. The active side 400 of the wafer 300 is provided with a plurality of scribe lines 406. Scribe lines 406 serve as dicing routes for the following dicing processes of the wafer 300. The scribe lines 406 demarcate the wafer 300 into a plurality of chip regions 405. For example, a region A in FIG. 1 includes a first chip region 402 and a second chip region 404 with a scribe line 406 positioned in between. A plurality of first contact pads 302 is disposed in the first chip region 402 to provide an input/output signal for the metal interconnection. The first contact pads 302 are preferably disposed at the edges of said first chip regions 402. A plurality of second contact pads 304 is disposed in a second chip region 404 to provide an input/output signal for the metal interconnection. The second contact pads 304 are preferably disposed at the edges of second chip region 404. In one embodiment of the present invention, the first contact pads 302 and the second contact pads 304 are disposed opposite to each other. That is to say, each first contact pad 302 corresponds to a second contact pad 304.

Subsequently, as shown in FIG. 2 and FIG. 3, a plurality of openings 306 are formed on the active side 400 of the wafer 300, and those openings 306 are formed along scribe lines 406. In one preferred embodiment of the present invention, openings 306 are formed between the first contact pads 302 and the second contact pads 304. Preferably, all of them are aligned on one straight line. The method for forming the openings 306 includes, for example, dry etching, and they are formed with an aperture ranging from about 1 to 50 μm and a depth ranging from 30 to 200 μm on the active side 400 of the wafer 300, but the forming method and embodiment of the openings 306 is not limited thereto. For example, the openings 306 may have different shapes, other than circular ones, depending on the product requirements.

As shown in FIG. 4 and FIG. 5, a plurality of patterned conductive layers 308 is formed on the active side 400 of the wafer 300, wherein each patterned conductive layer 308 fills up at least an opening 306 and electrically connects the first contact pad 302 and the second contact pad 306 corresponding to the opening 306. The material of the patterned conductive layer may include, for example, Au, Ag, Cu, Al, Mo, Ti, Ta, Cd, a nitride, an oxide, an alloy or a combination thereof. A thinning process is then carried out, for example, a chemical mechanical polishing (CMP) process or an etching process on the back side 408, in order to expose the patterned conductive layer 308 on the back side 408.

As shown in FIG. 6 and FIG. 7, a dicing process is finally performed along the scribe line 406 by using a cutting tool, forming this way a first chip 314 in the first chip region 402 of the wafer 300 and a second chip 316 in the second chip region 404 of the wafer 300. Since the patterned conductive layer 308 filling up the openings 306 is positioned on the scribe lines 406, the patterned conductive layer 308 is divided into two parts after performing the dicing process, wherein a first patterned conductive layer 310a is formed from the patterned conductive layer 308 in a first chip region 402 on the active side 400a of a first chip 314, and a first lateral TSV 312a is disposed on one lateral side 410a of the first chip 314. A second patterned conductive layer 310b is formed from the patterned conductive layer 308 in a second chip region 404 on the active side 400b of a second chip 316, and a second lateral TSV 312b is disposed on one lateral side 410b of the second chip 316. This way a semiconductor structure (i.e. the first chip 314 or the second chip 316) with a lateral TSV in present invention is completed.

As shown in FIG. 7, the first chip 314 in the present invention is provided with an active side 400a, a back side 408 opposite to the active side 400a, and a back side 410a positioned between the active side 400a and the back side 408a. The fist chip 314 is also provided with a first contact pad 302, a first lateral TSV 312a and a first patterned conductive layer 310a. The first contact pad 302 is disposed on the active side 400a of the first chip 314 and electrically connects the metal interconnection (not shown) to semiconductor devices (not shown) inside the first chip 314. The first patterned conductive layer 310a is disposed on the active side 400a and electrically connects the first lateral TSV 312a and the first contact pad 302. The first lateral TSV 312a is disposed on the lateral side 410a of the first chip 314. Since the first lateral TSV 312a is positioned on the scribe line 406 and is formed together with the lateral side 410a of the first chip 314, so the first lateral TSV 312a includes an exposed sidewall 313a and the sidewall 313a is leveled with the lateral side 410a of the first chip 314 in a way that the first lateral TSV 312a is embedded inwardly into the first chip 314. The embedded portion of the first lateral TSV 312a is substantially semicircular. However, in another embodiment of the present invention, the first lateral TSV 312a may be of another shape, like rectangular, depending on the shape of the opening 306 and the relative position of the opening 306 on the scribe line 406 during the forming step.

Figure 8:
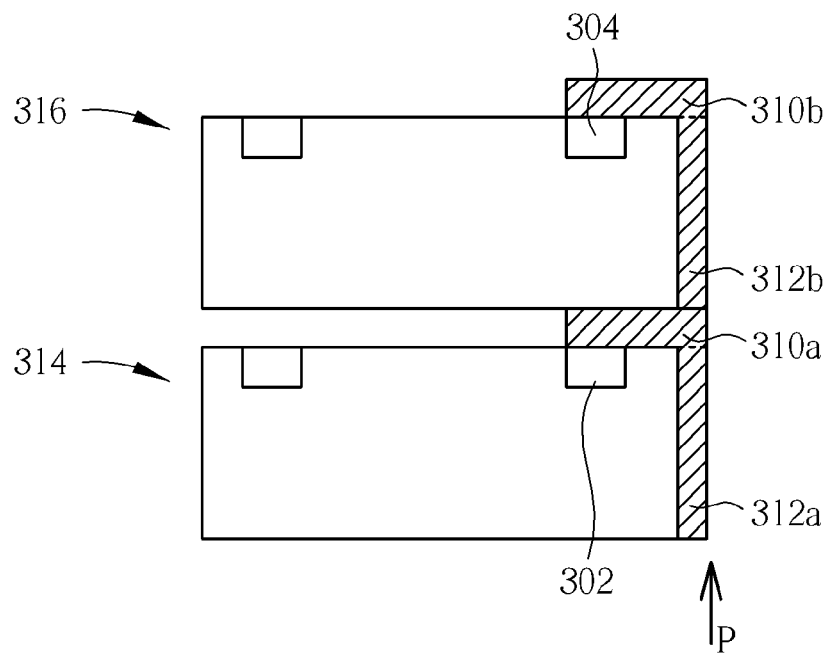
FIGS. 8-10 are schematic views of a chip package process in accordance with the present invention.

The lateral TSV of the present invention enables various combining designs for the following chip packaging processes. Please refer to FIG. 8-10, which are schematic views of chip packaging processes of the present invention. As shown in FIG. 8, the first chip 314 and second chip 316 may be stacked in a way that electrically connects the first patterned conductive layer 310a of first chip 314 to the second lateral TSV 312b of the second chip 316. This way, the first contact pad 302 of the first chip 314 and the second contact pad 304 of the second chip 316 may be electrically connected by the lateral TSV to provide the transmission route for the input/output signal. For example, if the first lateral TSV 312a serves as a power pin, a power P may be provided on the first lateral TSV 312a of first chip 314 so that the first chip 314 and the second chip 316 may transit the power respectively to the first contact pad 302 and the second contact pad 304 through the first lateral TSV 312a and the second lateral TSV 312b. Please note that the number of stacked chips is not limited to two in the present invention: a plurality of chips may be stacked together.

Figure 9:
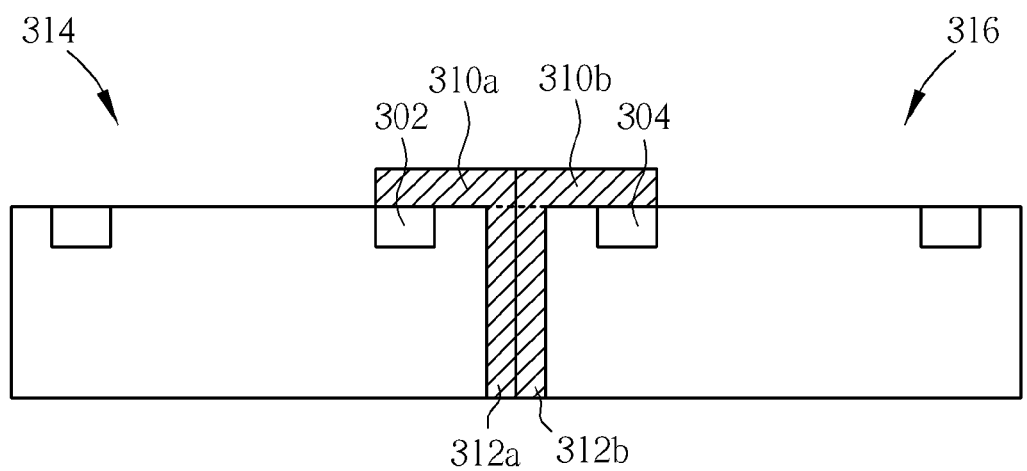
Figure 10:
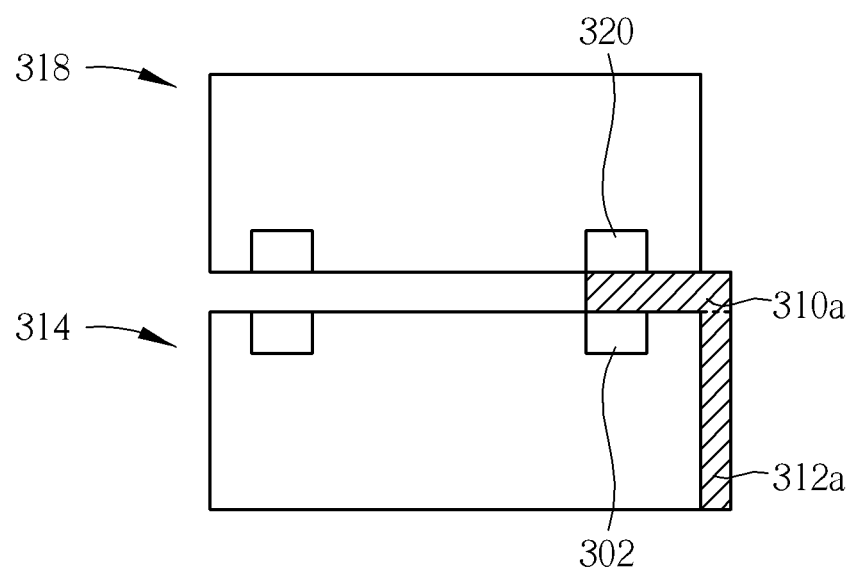

As shown in FIG. 9, the first chip 314 and the second chip 316 may be juxtaposed so that the first lateral TSV 312a in the first chip 314 is electrically connected to the second lateral TSV 312b in the second chip 316. Alternatively, in another embodiment, as shown in FIG. 10, the first chip 314 may be stacked with a conventional chip having contact pads. For example, the first chip 314 may be stacked with a third chip 318, wherein the third chip 318 is provided with a third pad 320 disposed correspondingly to the first pad 302. Therefore, an external signal may still be transmitted to the first contact pad 302 and the third contact pad 320 through the first TSV 312a and the first patterned conductive layer 310a, thereby providing the input/output signal for the first chip 314 and the third chip 318.

Please note that the chip combination in FIG. 8-10 is merely a basic embodiment. With an increasing number of chip packages, the combinations of chip may be modified depending on the product requirements. For example, the chip having a lateral TSV in the present invention may be stacked with or juxtaposed with other chips so that the chip combination may be extended up and down or laterally, thereby improving the flexibility of the design of the chip packaging.

Accordingly, the present invention provides a semiconductor structure having lateral through silicon vias and a manufacturing method thereof. The semiconductor structure may include one single chip or a chip package constructed by a plurality of chips, in order to increase the signal transmission route between the chips.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
   a chip having an active side, a back side opposite to said active side, and a lateral side between said active side and said back side, said chip further comprises:
   a contact pad disposed on said active side of said chip;

a lateral TSV disposed on said lateral side; and
a patterned conductive layer disposed on said active side and electrically connected to said lateral TSV and said contact pad, wherein the lateral TSV and the patterned conductive layer are made from a same metal layer.

2. A semiconductor structure according to claim 1, wherein said lateral side is at the outermost side of said chip.

3. A semiconductor structure according to claim 1, wherein said TSV is provided with an exposed sidewall.

4. A semiconductor structure according to claim 3, wherein said sidewall of said lateral TSV is leveled with said lateral side so that said TSV is embedded in said chip.

5. A semiconductor structure according to claim 1, wherein said lateral TSV is substantially a semi-circular cylinder.

6. A semiconductor structure according to claim 1, further comprising the chip according to claim 1, wherein a chip is stacked over another chip so that the patterned conductive layer of the chip is electrically connected to the TSV of the another chip.

7. A semiconductor structure according to claim 1, further comprising the chip according to claim 1, wherein one chip is juxtaposed with another chip so that the lateral side of one of said chips is electrically connected with the lateral side of another chip.

8. A semiconductor structure according to claim 1, further comprising a second chip stacked on the chip, wherein said second chip is provided with a second contact pad electrically connecting to said patterned conductive layer.

9. A semiconductor structure according to claim 1, wherein said lateral TSV comprises metal.

* * * * *